United States Patent
Futakuchiya et al.

(10) Patent No.: US 9,153,463 B2
(45) Date of Patent: Oct. 6, 2015

(54) SUBSTRATE SUPPORT DEVICE

(75) Inventors: Jun Futakuchiya, Santa Clara, CA (US); Junichi Miyahara, Isehara (JP); Daisuke Hashimoto, Isehara (JP)

(73) Assignee: NHK Spring Co., Ltd., Kanagawa (JP)

( * ) Notice: Subject to any disclaimer, the term of this patent is extended or adjusted under 35 U.S.C. 154(b) by 445 days.

(21) Appl. No.: 13/304,493

(22) Filed: Nov. 25, 2011

(65) Prior Publication Data

US 2013/0134147 A1    May 30, 2013

(51) Int. Cl.
*H05B 3/68* (2006.01)
*H05B 3/02* (2006.01)
*H05B 3/44* (2006.01)
*H05B 3/50* (2006.01)
*H01L 21/67* (2006.01)
*H01L 21/687* (2006.01)

(52) U.S. Cl.
CPC .... *H01L 21/67103* (2013.01); *H01L 21/67109* (2013.01); *H01L 21/68735* (2013.01); *H01L 21/68785* (2013.01); *H05B 3/68* (2013.01)

(58) Field of Classification Search
CPC .......... H05B 3/68; H05B 3/143; H05B 3/265; H01L 21/683; H01L 21/67103; H01L 21/67109; H01L 21/67248; H01L 21/68785; H01L 21/68735
USPC ............... 118/725, 728, 720, 721; 219/443.1, 219/444.1, 538, 544, 546–548; 392/418; 432/258; 428/141, 149, 210, 220, 426, 428/428, 332, 334; 156/914, 916; 345.3; 427/448, 452; 65/17.3, 17.4
See application file for complete search history.

(56) References Cited

U.S. PATENT DOCUMENTS

| | | | |
|---|---|---|---|
| 4,988,848 A | | 1/1991 | Trakas |
| 5,592,581 A | * | 1/1997 | Okase ............................ 392/418 |
| 5,772,770 A | * | 6/1998 | Suda et al. ..................... 118/719 |
| 5,772,833 A | | 6/1998 | Inazawa et al. |
| 5,884,009 A | | 3/1999 | Okase |
| 6,242,719 B1 | * | 6/2001 | Kano et al. .................. 219/444.1 |
| 6,399,922 B2 | | 6/2002 | Okase et al. |
| 6,485,604 B1 | | 11/2002 | Okayama et al. |
| 7,084,068 B2 | * | 8/2006 | Suguro et al. ................. 438/708 |
| 7,372,001 B2 | | 5/2008 | Tachikawa et al. |

(Continued)

FOREIGN PATENT DOCUMENTS

JP    2007-184289    7/2007

OTHER PUBLICATIONS

Office Action for U.S. Appl. No. 13/667,512, mailed Jun. 11, 2015, 13 pages.

*Primary Examiner* — Sang Y Paik
*Assistant Examiner* — Gyounghyun Bae
(74) *Attorney, Agent, or Firm* — Nixon Peabody LLP; Jeffrey L. Costellia

(57) ABSTRACT

A substrate support device formed of a metal and having a high withstand voltage and a high thermal resistance is provided. A substrate support device according to the present invention includes a plate section formed of a metal; a shaft section connected to the plate section and formed of a metal; a heating element provided in the plate section; and an insulating film formed on a first surface of the plate section, the first surface opposite to the shaft section, by ceramic thermal spraying. The substrate support device may further include an insulating film formed on a second surface of the plate section which intersects the first surface of the plate section approximately perpendicularly.

16 Claims, 3 Drawing Sheets

(56) References Cited

U.S. PATENT DOCUMENTS

| | | |
|---|---|---|
| 7,390,583 B2* | 6/2008 | Miyaji et al. .................. 428/701 |
| 7,851,728 B2* | 12/2010 | Futakuchiya et al. ..... 219/444.1 |
| 8,056,503 B2* | 11/2011 | Kikuchi et al. ........... 118/723 E |
| 8,673,166 B2* | 3/2014 | Okita et al. ..................... 216/67 |
| 2002/0043527 A1 | 4/2002 | Ito |
| 2003/0232512 A1 | 12/2003 | Dickinson et al. |
| 2004/0086689 A1* | 5/2004 | Takahashi et al. ............ 428/141 |
| 2005/0037193 A1* | 2/2005 | Sun et al. ...................... 428/332 |
| 2005/0042881 A1* | 2/2005 | Nishimoto et al. ........... 438/710 |
| 2005/0118404 A1* | 6/2005 | Hamilton et al. ............. 428/210 |
| 2005/0253285 A1 | 11/2005 | Kuibira et al. |
| 2006/0005930 A1* | 1/2006 | Ikeda et al. ............... 156/345.51 |
| 2006/0051966 A1 | 3/2006 | Or et al. |
| 2006/0144516 A1 | 7/2006 | Ricci et al. |
| 2006/0213900 A1* | 9/2006 | Matsuda et al. ........... 219/444.1 |
| 2008/0237221 A1* | 10/2008 | Goto et al. ..................... 219/544 |
| 2009/0235866 A1* | 9/2009 | Kataigi et al. ................. 118/725 |
| 2010/0319615 A1* | 12/2010 | Higashijima et al. .......... 118/50 |
| 2011/0014417 A1 | 1/2011 | Lemak et al. |
| 2012/0033340 A1* | 2/2012 | Roy et al. ...................... 361/234 |

\* cited by examiner

SUBSTRATE SUPPORT DEVICE

FIELD

The present invention relates to a substrate support device usable for producing a semiconductor device, and specifically to a metal substrate support device having a built-in heating element.

BACKGROUND

In production of a semiconductor device, specifically in processing steps of chemical vapor deposition (CVD), surface reforming and the like, a substrate support device is provided in a semiconductor production apparatus. In the case where the substrate support device is used in the state of being heated, a substrate support device having a built-in heating element is provided in the semiconductor production apparatus. Such a substrate support device has a structure in which a plate formed of a metal or ceramic material is supported by a shaft. There are cases where a plasma electrode or a heating element is provided in the plate and is connected to a control device provided outside the semiconductor production apparatus via a line provided in the shaft.

For a plate of such a substrate support device, bulk ceramics such as aluminum nitride (AlN), aluminum oxide ($Al_2O_3$) and the like are often used. However, in order to provide a plasma electrode or a heating element in the substrate support device, the inside of the plate needs to have a complicated structure. It is difficult to process bulk ceramics into such a complicated structure. By contrast, a metal plate allows a complicated structure to be formed therein easily, and also at lower cost than bulk ceramics. In the case where a metal plate is used, a surface of the metal plate on which a substrate is to be mounted needs to be covered with an insulating material, and contamination of the substrate with metal caused by contact needs to be reduced. For example, Japanese Laid-Open Patent Publication No. 2007-184289 describes a metal plate which is given an alumite treatment (an anodizing).

However, when a metal plate is anodized, the anodized film has a thickness of about 50 to 75 μm and a withstand voltage of about 0.8 to 1 kV. It is difficult to realize a higher withstand voltage. For producing a precision semiconductor device of, for example, the 25 nm process or the like, the metal plate needs to be covered with a material having a high thermal resistance in order to prevent the metal from being contaminated.

The present invention for solving the above-described problems has an object of providing a substrate support device formed of a metal and having a high withstand voltage and a high thermal resistance.

SUMMARY

An embodiment of the present invention provides a substrate support device comprising a plate section formed of a metal; a shaft section connected to the plate section and formed of a metal; a heating element provided in the plate section; and an insulating film formed on a first surface of the plate section, the first surface opposite to the shaft section, by ceramic thermal spraying.

The substrate support device may further comprise an insulating film formed on a second surface of the plate section which intersects the first surface of the plate section approximately perpendicularly.

In the substrate support device, the second surface of the plate section may have a portion having a curvature, having a value nearly equal to a thickness of the plate section, which is curved outward toward a third surface of the plate section, the third surface being connected to the shaft section.

In the substrate support device, the third surface may have an insulting film formed thereon.

In the substrate support device, the first surface of the plate section may have a recessed portion; and an edge between the recessed portion and a peripheral non-recessed portion of the first surface, and an edge between the first surface and the second surface, may each have a curvature.

According to the present invention, a metal substrate support device having a high withstand voltage and a high thermal resistance can be provided.

DESCRIPTION OF EMBODIMENTS

Hereinafter, a substrate support device according to an embodiment of the present invention will be described with reference to the drawings. The following embodiment is directed to an example of substrate support device according to the present invention, and the substrate support device according to the present invention is not limited to the following embodiment.

With a thickness of an anodized film, it is difficult to provide a metal plate with a sufficiently high withstand voltage. Therefore, the present inventors made researches to find a method for forming a ceramic film on a metal plate, which can realize a higher withstand voltage. One method for forming an insulating ceramic film on a metal plate is ceramic thermal spraying. With this method, a high withstand voltage can be realized but the resultant ceramic layer is cracked under a high temperature condition and as a result, the plate is corroded or arc discharge occurs between the plate and the substrate. For this reason, it is difficult to improve the yield of semiconductor devices. Accordingly, it is difficult to realize a high withstand voltage and a high thermal resistance at the same time by merely performing ceramic thermal spraying with a low-fusing.

As a result of conducting active studies on these problems, the present inventors have found that by forming a thinnest possible insulating film in the range in which a desired withstand voltage can be realized, a substrate support device which is not cracked even under a high temperature condition can be provided.

Embodiment 1

Figure 1:
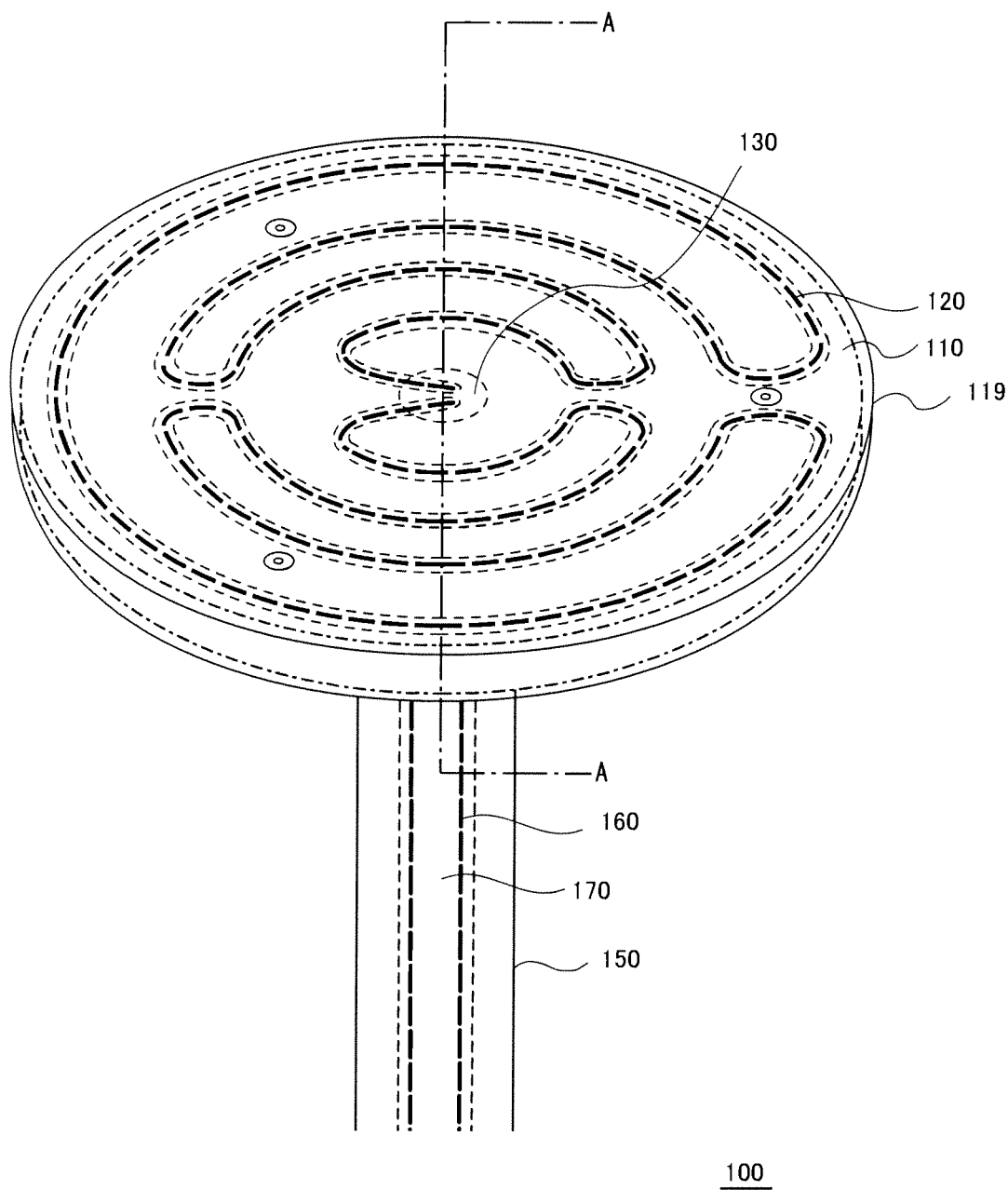
FIG. 1 is a perspective view of a substrate support device 100 according to an embodiment of the present invention.
Figure 2:
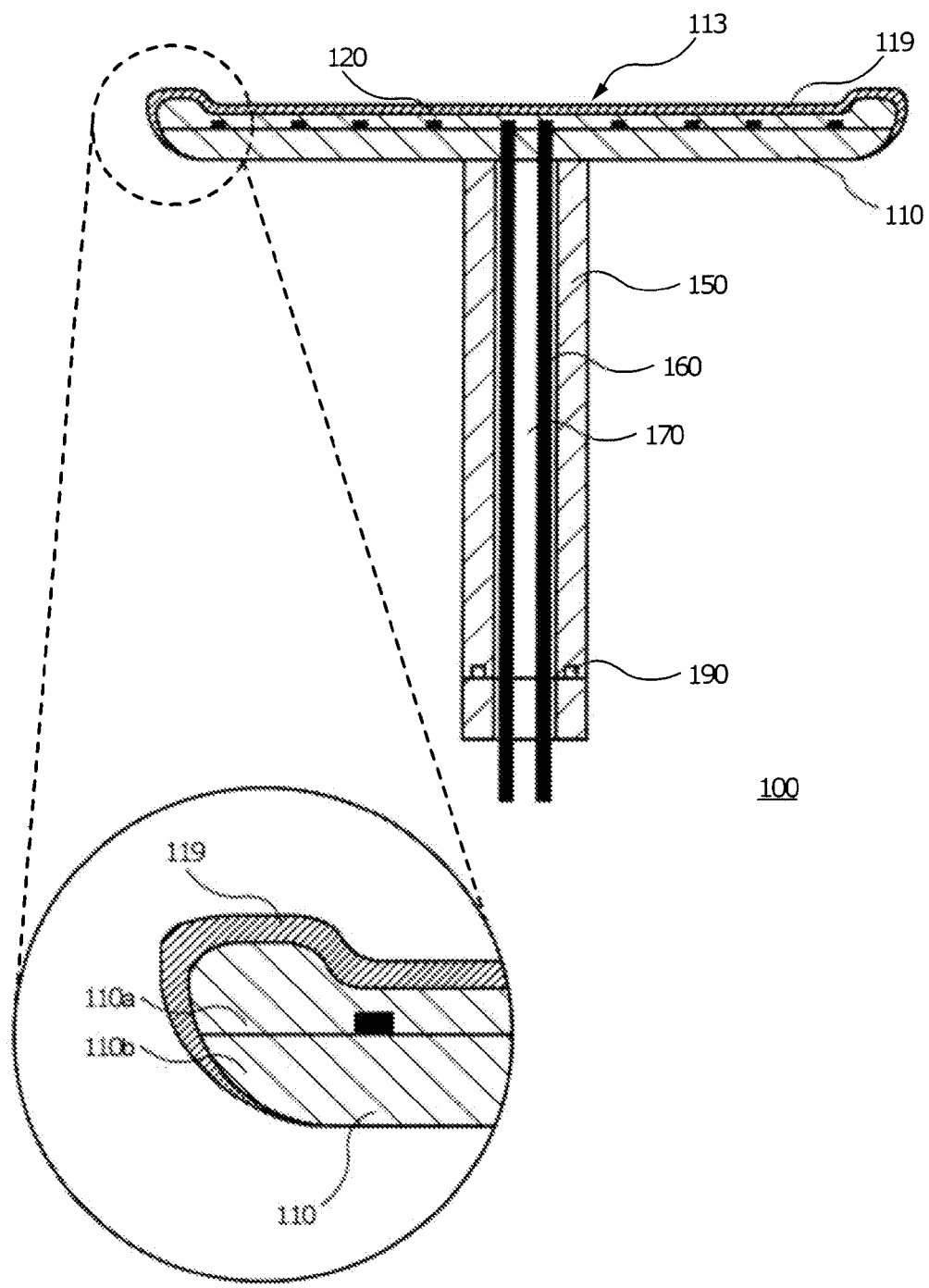
FIG. 2 is a cross-sectional view of the substrate support device 100 according to the embodiment of the present invention taken along line A-A' in FIG. 1.

FIG. 1 is a perspective view of a substrate support device 100 according to an embodiment of the present invention. FIG. 2 is a cross-sectional view of FIG. 1 taken along line A-A' in FIG. 1. The substrate support device 100 in this embodiment includes a plate section 110, a shaft section 150, and a heating element 120 provided in the plate section 110. A top surface of the plate section 110 has a recessed portion 113 for supporting a substrate. The shaft section 150 is connected to a central part of a rear surface, of the plate section 110, opposite to the top surface having the recessed portion 113. The shaft section 150 has a hollow structure 170. In the hollow structure 170 of the shaft section 150, a line 160 connected to the heating element 160 and also to a control device (not shown) outside the substrate support device 100 is provided.

The substrate support device 100 includes an insulating film 119 formed on the surface 113 of the plate section 110 for supporting the substrate and also on a side surface of the plate section 110. The top surface and the side surface of the plate section 110 intersect each other approximately perpendicularly, and the side surface of the plate section 110 has a portion having a curvature which is curved outward toward a connection position on the rear surface of the plate section 110, at which the plate section 110 is connected to the shaft section 150. In the plate section 110, an edge between the recessed portion 113 and a peripheral non-recessed portion of the top surface, and an edge between the top surface and the side surface, are rounded off so as to curved outward with a curvature.

The plate section 110 and the shaft section 150 in this embodiment are formed of a metal. A metal to be used can be selected from materials known as being usable for producing substrate support devices. Usable metals include, for example, aluminum, stainless steel, copper, nickel, titanium and the like. The plate section 110 includes two components 110a and 110b. A groove is formed in either the component 110a or 110b, and the heating element 120 is located in the groove. The components 110a and 110b are joined together by soldering or welding.

By forming the plate section 110 and the shaft section 150 of a metal, a coolant flow path 190 shown in FIG. 2 may be formed in the shaft section 150. The coolant flow path 190 is a mechanism for allowing a gas such as air or the like or a liquid such as oil, an aqueous solution of ethylene glycol or the like to circulate to assist the shaft section 150 in adjusting the temperature of a heater. Such a complicated structure cannot be easily formed when the shaft section is formed of a ceramic material, but can be formed in the shaft section 150 by soldering or welding since the shaft section 150 is formed of a metal. This mechanism provides higher-level temperature adjustment means. In addition, the above-mentioned rounding can be conducted easily when the plate section 110 is formed of a metal.

According to the present invention, the insulating film 119 is formed by ceramic thermal spraying. When ceramic thermal spraying is used, it is possible to form the insulating film 119 to be thicker than an anodized film. However, when the insulating film 119 is made thicker by ceramic thermal spraying, the insulating film 119 is cracked under a high temperature condition. The insulating film 119 according to the present invention is formed to be as thin as possible in the range in which a desired withstand voltage can be realized. Accordingly, the thickness of the insulating film 119 is set to any value in accordance with a required withstand voltage. The plate section 110, which is rounded as described above, can suppress a stress from being concentrated on the edges of the insulating film 119 so that the insulating film 119 is not easily cracked even under a high temperature condition.

The insulating film 119 in this embodiment can be formed of any known material which realizes a desired withstand voltage and can be ceramic-thermal-sprayed. For example, as the material of the insulating film 119, an oxide of at least one of alkaline earth metals, rare-earth metals, Al, Ta and Si can be selected. Specifically, aluminum oxide ($Al_2O_3$), magnesium oxide (MgO), yttrium oxide ($Y_2O_3$) and the like are usable. According to the present invention, a combination of a metal and an insulating material which have a small difference in the coefficient of thermal expansion is used. When the difference in the coefficient of thermal expansion is large between the plate section 110 and the insulating film 119, the insulating film 119 is easily cracked under a high temperature condition. An example of combination of a metal and an insulating material which have a small difference in the coefficient of thermal expansion is a combination of aluminum (Al) and aluminum oxide. When the plate section 110 is formed of aluminum and the insulating film 119 is formed of aluminum oxide, the insulating film 119 is not cracked easily. In general, ceramics have properties weak against a tensile stress. It is considered that when the plate section 110 is formed of aluminum, which is thermally expandable, the plate section 110 is expanded along the insulating plate 119 under a high temperature condition and thus the insulating plate 119 is not cracked easily.

In this embodiment, it is preferable that the ceramic insulating film 119 formed by ceramic thermal spraying has a stoichiometric composition or a composition close thereto. When being formed of a stoichiometric composition or a composition close thereto, the insulating film 119 is not cracked easily even under a high temperature condition. When the amount of oxygen in the ceramic film is significantly lower than that of the stoichiometric composition, the insulating film 119 is easily cracked and thus the substrate support device cannot exhibit a sufficiently high withstand voltage. By contrast, when the amount of oxygen in the ceramic film is significantly higher than that of the stoichiometric composition, the adhesiveness of the insulating film 119 to the plate section 110 is lowered, which is not preferable.

For ceramic thermal spraying conducted to form the insulating film 119 in this embodiment, oxygen gas or oxygen-containing gas is used as plasma working gas. By using oxygen gas or oxygen-containing gas as plasma working gas, the composition of the insulating film 119 formed by ceramic thermal spraying can be made closer to the stoichiometric composition than the composition of a film formed by conventional thermal spraying. Thus, a high electrical insulating property and a high corrosion resistance can be realized at the same time.

For forming the insulating film 119 in this embodiment, a thermal-sprayed film having a larger thickness than the thickness at which a desirable withstand voltage can be realized is formed by ceramic thermal spraying. Then, the thermal-sprayed film is processed with surface polishing to obtain the desired thickness. In this embodiment, it is preferable that the ceramic thermal spraying is performed in at least two directions, i.e., a direction toward the top surface of the plate section 110 and a direction toward the side surface thereof. In order to provide the surface of the plate section 110 with the insulating property without fail to prevent the metal from being contaminated, the insulating film 119 is formed on two surfaces, i.e., the top surface and the side surface. As described above, in this embodiment, the side surface of the plate section 110 has a portion having a curvature which is curved outward toward the connection position with the shaft section 150 on the rear surface. Therefore, on the side surface of the plate section 110, the insulating film 119 is formed to be gradually thinner toward the connection position with the shaft section 150 on the rear surface, and thus the insulating film 119 is not easily delaminated from the plate section 110.

In this embodiment, for the purpose of reducing stress concentration, it is desirable that the curvature (R value) of the portion of the side surface which is curved outward toward the connection position with the shaft section 150 is large. In this embodiment, it is preferable that this curvature is nearly equal to the thickness of the plate section 110. Owing to this, the insulating film 110 can be formed to be gradually thinner from the side surface of the plate section 110 toward the connection position with the shaft section 150 on the rear surface, by thermal spraying conducted from a position to the side of the plate section 110.

The substrate support device 100 in this embodiment may include a buffer layer, for alleviating the difference in the withstand voltage, formed between the plate section 110 and the insulating film 119. For the buffer layer in this embodiment, magnesium oxide (MgO), for example, is usable.

Where the coefficient of thermal expansion of the plate section 110 is $\alpha_s$, the coefficient of thermal expansion of the insulating film 119 is $\alpha_f$, the working temperature during the thermal spraying is $T_0$, the room temperature is $T_1$, the temperature of the heater in use is $T_2$, and the Young's modulus of the insulating film 119 is E, the thermal stress $\sigma$ generated in the insulating film 119 is represented by the following expressions in the case where the thickness of the plate section 100 is significantly larger than the thickness of the insulating film 119.

During cold working: $\sigma = (\alpha_s - \alpha_1) \cdot E \cdot (T_0 - T_1)$

During hot working: $\sigma = (\alpha_s - \alpha_1) \cdot E \cdot (T_0 - T_2)$

During cold working, $(T_0-T_1)$ has a positive value, and because $\alpha_s > \alpha_f$ has a positive value and the insulating film 119 receives a compressive stress. However, when the substrate support device 100 is used in the state of being heated at a temperature exceeding the temperature of the plate section 110 used during the thermal spraying, $\sigma$ has a negative value and the insulating film 119 receives a tensile stress, which causes cracks. The generation of the tensile stress in such a temperature range or the vicinity thereof can be suppressed by, for example, setting the working temperature during the thermal spraying to a range of 150° C. or higher and 200° C. or lower.

As described above, a substrate support device according to the present invention can be processed in a complicated manner because the plate section and the shaft section are formed of a metal, and is not easily cracked even under a high temperature condition and thus can realize a high withstand voltage because a thin insulating film is formed on the plate section by ceramic thermal spraying.

Embodiment 2

Figure 3:
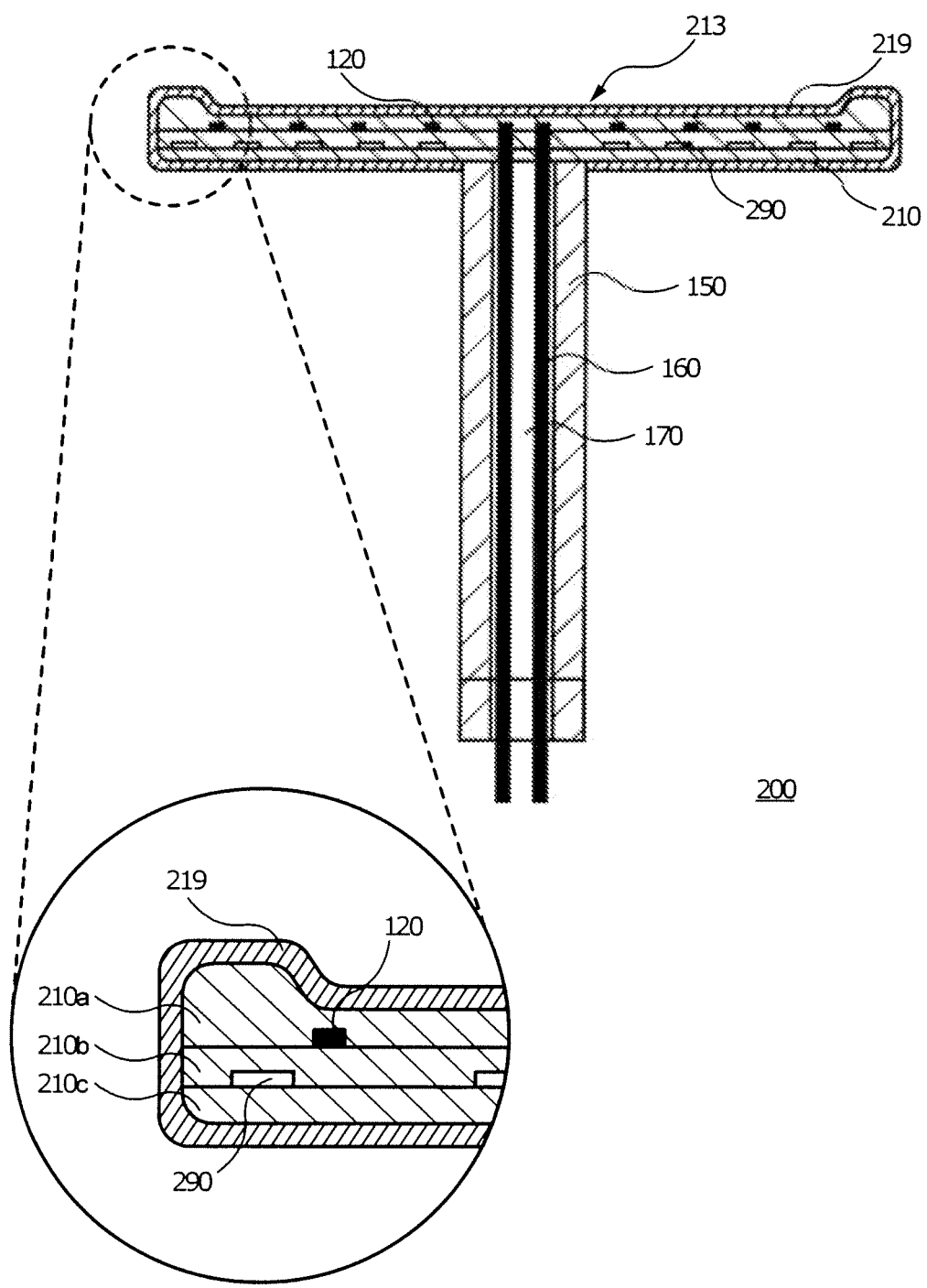
FIG. 3 is a cross-sectional view of a substrate support device 200 according to an embodiment of the present invention taken along a line corresponding to line A-A' in FIG. 1.

FIG. 3 is a cross-sectional view of a substrate support device 200 according to an embodiment of the present invention taken along a line corresponding to line A-A' in FIG. 1. The substrate support device 200 in this embodiment comprises a plate section 210 including three components 210a, 210b and 210c instead of the plate section 110. The heating element 120 is provided in a groove formed in the component 210a or 210b. The component 210b or 210c has a groove formed therein, which is used as a coolant flow path 290. A top surface of the plate section 210 has a recessed portion 213 for supporting a substrate, and a shaft section 150 is connected to a central part of a rear surface, of the plate section 210, opposite to the top surface having the recessed portion 213. The shaft section 150 is substantially the same as that described in Embodiment 1 and therefore will not be described in detail.

The substrate support device 200 includes an insulating film 219 formed on the surface 213 of the plate section 210 for supporting the substrate, on a side surface of the plate section 210, and on the rear surface of the plate section 210 which is connected to the shaft section 150. The top surface and the side surface of the plate section 210, and the side surface and the rear surface thereof, intersect each other approximately perpendicularly. An edge between the top surface and the side surface, and an edge between the side surface and the rear surface, are rounded off so as to be curve outward with a curvature. An edge between the recessed portion 213 and a peripheral non-recessed portion of the top surface of the plate section 210 is rounded off to be curved outward with a curvature.

The plate section 210 and the shaft section 150 in this embodiment are formed of a metal. Usable metals are described in Embodiment 1 and will not be described in detail. By forming the plate section 210 and the shaft section 150 of a metal, the components 210a, 210b and 210c can be joined together by soldering or welding, and also the plate section 210 and the shaft section 150 can be joined together by soldering or welding.

The coolant flow path 290 is a mechanism for assisting the adjustment of the temperature of a heater. As long as the temperature of the heater can be efficiently adjusted, the coolant flow path 290 may be located in the same manner as the heating element 120, or spirally, in the plate section 210. Such a complicated structure cannot be easily formed when the plate section is formed of a ceramic material, but can be formed in the plate section 210 since the plate section 210 is formed of a metal. This mechanism provides higher-level temperature adjustment means. In addition, the above-mentioned rounding can be conducted easily when the plate section 210 is formed of a metal.

According to the present invention, the insulating film 219 is formed by ceramic thermal spraying. The insulating film 219 according to the present invention is formed to be as thin as possible in the range in which a desired withstand voltage can be realized. Accordingly, the thickness of the insulating film 219 is set to any value in accordance with a required withstand voltage. The plate section 210, which is rounded as described above, can suppress a stress from being concentrated on the edges of the insulating film 219 so that the insulating film 219 is not easily cracked even under a high temperature condition.

The insulating film 219 in this embodiment can be formed of any material which realizes a desired withstand voltage and can be ceramic-thermal-sprayed. Usable metals are described in Embodiment 1 and will not be described in detail. As described above, in this embodiment, it is preferable that the ceramic insulating film 219 formed by ceramic thermal spraying has a stoichiometric composition or a composition close thereto. When being formed of a stoichiometric composition or a composition close thereto, the insulating film 219 is not cracked easily even under a high temperature condition.

For ceramic thermal spraying conducted to form the insulating film 219 in this embodiment, oxygen gas or oxygen-containing gas is used as plasma working gas. By using oxygen gas or oxygen-containing gas is used as plasma working gas, the composition of the insulating film 219 formed by ceramic thermal spraying can be made closer to the stoichiometric composition than the composition of a film formed by conventional thermal spraying. Thus, a high electrical insulating property and a high corrosion resistance can be realized at the same time.

For forming the insulating film 219 in this embodiment, a thermal-sprayed film having a larger thickness than the thickness at which a desirable withstand voltage can be realized is formed by ceramic thermal spraying. Then, the thermal-sprayed film is processed with surface polishing to obtain the desired thickness. In this embodiment, it is preferable that the ceramic thermal spraying is performed in three directions, i.e., a direction toward the top surface of the plate section 210, a direction toward the side surface thereof, and a direction toward the rear surface thereof. The side surface of the plate section 210 in this embodiment may be processed to have a portion having a curvature which is curved outward toward the connection position with the shaft section 150 on the rear surface as described above in Embodiment 1, instead of having the edge between the side surface and the rear surface. In this case, the formation of the insulating film 219 on the rear surface of the plate section 210 may be omitted to simplify the production process.

The substrate support device 200 in this embodiment may include a buffer layer, for alleviating the difference in the withstand voltage, formed between the plate section 210 and the insulating film 219. For the buffer layer in this embodiment, magnesium oxide (MgO), for example, is usable.

As described above, a substrate support device according to the present invention can be processed in a complicated manner because the plate section and the shaft section are formed of a metal, and is not easily cracked even under a high temperature condition and thus can realize a high withstand voltage because a thin insulating film is formed on the plate section by ceramic thermal spraying.

Examples

Hereinafter, an example of the substrate support device 100 according to the present invention described above will be shown and described in detail.

In this example, the plate section 110 was formed of aluminum, and the insulating film 119 was formed of aluminum oxide. For producing the insulating film 119, ceramic thermal spraying was performed to form a thermal-sprayed film having a thickness of 250 μm to 300 μm, and then the thermal-sprayed film was polished to have a thickness of 100 μm to 150 μm.

Samples of the substrate support device 100 thus produced were heated at 120° C., 150° C., 200° C. and 250° C. for 5 hours in an oven to inspect whether the insulating film 119 of each sample was cracked or not. In any of the samples, no crack was generated. The investigation results are summarized in Table 1.

TABLE 1

| Thickness (μm) | Heated at 250° C. | Dielectric strength (2 kV DC) |
|---|---|---|
| 70.9 | ○ | X |
| 77.7 | ○ | ○ |
| 84.7 | ○ | X |
| 84.8 | ○ | ○ |
| 86.4 | ○ | ○ |
| 86.7 | ○ | X |
| 88.1 | ○ | X |
| 91.1 | ○ | ○ |
| 93.1 | ○ | ○ |
| 97.1 | ○ | ○ |
| 100.2 | ○ | ○ |
| 105.3 | ○ | ○ |
| 129.4 | ○ | ○ |
| 137.3 | ○ | ○ |
| 142.0 | ○ | ○ |
| 144.0 | ○ | ○ |
| 144.8 | ○ | ○ |
| 154.7 | ○ | ○ |
| 163.0 | ○ | ○ |

TABLE 1-continued

| Thickness (μm) | Heated at 250° C. | Dielectric strength (2 kV DC) |
|---|---|---|
| 164.9 | ○ | ○ |
| 168.1 | ○ | ○ |
| 168.5 | ○ | ○ |
| 170.1 | ○ | ○ |
| 300.0 | X | |

By contrast, in the case where the post-polishing thickness of the insulating film 119 was 300 μm or larger, cracks were generated. In a dielectric strength test in which a DC voltage (DC) of 2 kV was applied to the samples, the insulating film 119 was destroyed when the thickness thereof was less than 90 μm. From these results, it has been found that the thickness of the insulating film 119 is preferably 100 μm or larger and 200 μm or less.

The invention claimed is:

1. A substrate support device, comprising:
a plate section formed of a metal;
a shaft section connected to the plate section and formed of a metal;
a heating element provided in the plate section;
a first insulating film formed on a first surface of the plate section, the first surface opposite to the shaft section, by ceramic thermal spraying; and
a second insulating film formed on a second surface of the plate section which intersects the first surface of the plate section approximately perpendicularly, by ceramic thermal spraying,
wherein:
the first surface of the plate section has a recessed portion;
an edge between the recessed portion and a peripheral non-recessed portion of the first surface has a curvature rounded off so as to be curved outward, and an edge between the first surface and the second surface has a curvature rounded off so as to be curved outward;
the first and second insulating films are insulating films as thin as possible in a range to achieve a desired withstand voltage;
the second surface of the plate section has a portion having a curvature, and having a value nearly equal to a thickness of the plate section, which is curved outward toward a third surface of the plate section, the third surface being connected to the shaft section;
the second insulating film is gradually thinner from the second surface of the plate section toward a connection position with the shaft section on the third surface; and
the first insulating film connects the second insulating film on the edge between the first surface and the second surface, a connection part of the first insulating film and the second insulating film has a curvature rounded off so as to be curved outward.

2. The substrate support device according to claim 1, wherein the first and second insulating films are formed of a material being ceramic-thermal-sprayed, the material of the first and second insulating films is selected from an oxide of at least one of alkaline earth metals, rare-earth metals, Al, Ta and Si, a difference in the coefficient of thermal expansion between the plate section and the first and second insulating films is small.

3. The substrate support device according to claim 2, wherein the material of the first and second insulating films is selected from aluminum oxide ($Al_2O_3$), magnesium oxide (MgO) and yttrium oxide ($Y_2O_3$).

4. The substrate support device according to claim 3, wherein a material of the plate section is aluminum (Al) and the material of the first and second insulating films is aluminum oxide.

5. The substrate support device according to claim 4, wherein the thickness of the first and second insulating films is 100 μm or larger and 200 μm or less.

6. The substrate support device according to claim 2, wherein the first and second insulating films formed by ceramic thermal spraying have a stoichiometric composition or a composition close thereto.

7. The substrate support device according to claim 1, further comprising a buffer layer formed between the plate section and the first and second insulating films.

8. The substrate support device according to claim 7, wherein the buffer layer is made of magnesium oxide (MgO).

9. A substrate support device, comprising:
a plate section formed of a metal;
a shaft section connected to the plate section and formed of a metal;
a heating element provided in the plate section;
a first insulating film formed on a first surface of the plate section, the first surface opposite to the shaft section, by ceramic thermal spraying;
a second insulating film formed on a second surface of the plate section which intersects the first surface of the plate section approximately perpendicularly, by ceramic thermal spraying; and
a third insulating film formed on a third surface of the plate section by ceramic thermal spraying, the third surface being connected to the shaft section,
wherein:
the first surface of the plate section has a recessed portion;
an edge between the recessed portion and a peripheral non-recessed portion of the first surface has a curvature rounded off so as to be curved outward, an edge between the first surface and the second surface has a curvature rounded off so as to be curved outward and an edge between the second surface and the third surface has a curvature rounded off so as to be curved outward;
the first, second and third insulating films are insulating films as thin as possible in a range to achieve a desired withstand voltage,
the first insulating film connects the second insulating film on the edge between the first surface and the second surface a connection part of the first insulating film and the second insulating film has a curvature rounded off so as to be curved outward; and
the second insulating film connects the third insulating film on the edge between the second surface and the third surface, a connection part of the second insulating film and the third insulating film has a curvature rounded off so as to be curved outward.

10. The substrate support device according to claim 9, wherein the first and second insulating films are formed of a material being ceramic-thermal-sprayed, the material of the first and second insulating films is selected from an oxide of at least one of alkaline earth metals, rare-earth metals, Al, Ta and Si, a difference in the coefficient of thermal expansion between the plate section and the first and second insulating films is small.

11. The substrate support device according to claim 10, wherein the material of the first and second insulating films is selected from aluminum oxide ($Al_2O_3$), magnesium oxide (MgO) and yttrium oxide ($Y_2O_3$).

12. The substrate support device according to claim 11, wherein a material of the plate section is aluminum (Al) and the material of the first and second insulating films is aluminum oxide.

13. The substrate support device according to claim 12, wherein the thickness of the first and second insulating films is 100 μm or larger and 200 μm or less.

14. The substrate support device according to claim 10, wherein the first and second insulating films formed by ceramic thermal spraying have a stoichiometric composition or a composition close thereto.

15. The substrate support device according to claim 9, further comprising a buffer layer formed between the plate section and the first and second insulating films.

16. The substrate support device according to claim 15, wherein the buffer layer is made of magnesium oxide (MgO).

* * * * *